US006811470B2

(12) United States Patent
Bonner et al.

(10) Patent No.: US 6,811,470 B2
(45) Date of Patent: Nov. 2, 2004

(54) METHODS AND COMPOSITIONS FOR CHEMICAL MECHANICAL POLISHING SHALLOW TRENCH ISOLATION SUBSTRATES

(75) Inventors: Benjamin A. Bonner, Campbell, CA (US); Anand N. Iyer, Santa Clara, CA (US); Deepak N. Kumar, Sunnyvale, CA (US); Thomas H. Osterheld, Mountain View, CA (US); Wei-Yung Hsu, Santa Clara, CA (US); Yong-Sik R. Kim, Santa Clara, CA (US); Christopher W. Smith, Los Altos Hills, CA (US); Huanbo Zhang, Cupertino, CA (US)

(73) Assignee: Applied Materials Inc., Santa Clara, CA (US)

( * ) Notice: Subject to any disclaimer, the term of this patent is extended or adjusted under 35 U.S.C. 154(b) by 118 days.

(21) Appl. No.: 10/194,560

(22) Filed: Jul. 12, 2002

(65) Prior Publication Data

US 2003/0036339 A1 Feb. 20, 2003

Related U.S. Application Data

(60) Provisional application No. 60/325,063, filed on Sep. 26, 2001, and provisional application No. 60/305,721, filed on Jul. 16, 2001.

(51) Int. Cl.⁷ .............................................. B24B 1/00
(52) U.S. Cl. ................................... 451/41; 451/28
(58) Field of Search .................. 451/41, 28, 285–288, 451/36–37, 57, 59

(56) References Cited

U.S. PATENT DOCUMENTS

| 4,169,337 A | 10/1979 | Payne ...................... 51/283 R |
| 4,588,421 A | 5/1986 | Payne ........................ 51/308 |
| 4,752,628 A | 6/1988 | Payne ........................ 523/122 |
| 5,152,917 A | 10/1992 | Pieper et al. ................. 51/295 |
| 5,244,534 A | 9/1993 | Yu et al. ...................... 156/636 |
| 5,340,370 A | 8/1994 | Cadien et al. ................ 51/308 |
| 5,342,419 A | 8/1994 | Hibbard ........................ 51/308 |
| 5,368,619 A | 11/1994 | Culler ........................ 51/308 |
| 5,378,251 A | 1/1995 | Culler et al. ................. 51/295 |
| 5,395,801 A | 3/1995 | Doan et al. ................. 437/225 |
| 5,453,312 A | 9/1995 | Haas et al. ................. 428/143 |
| 5,614,444 A | 3/1997 | Farkas et al. ............... 437/225 |
| 5,692,950 A | 12/1997 | Rutherford et al. ......... 451/552 |
| 5,738,574 A | 4/1998 | Tolles et al. ................ 451/288 |
| 5,738,800 A | 4/1998 | Hosali et al. ................. 216/99 |
| 5,759,917 A | 6/1998 | Grover et al. ............. 438/690 |

(List continued on next page.)

FOREIGN PATENT DOCUMENTS

| EP | 1 068 928 A2 | 1/2000 | ......... B24B/37/04 |
| EP | 1 061 111 A1 | 12/2000 | ............ C09K/3/14 |
| JP | 2000156360 | 6/1999 | ......... H01L/21/304 |
| JP | 2000068371 | 3/2000 | ........... H01L/21/76 |

(List continued on next page.)

OTHER PUBLICATIONS

US 6,204,181, 3/2001, Molnar (withdrawn)
PCT Search Report for US 02/22587 dated Apr. 14, 2003.
Gagliardi, et al., "3M SlurryFree™ CMP Fixed Abrasives for Direct HDP STI CMP," Technical Brief, Oct. 2000.

Primary Examiner—Lee D. Wilson
(74) Attorney, Agent, or Firm—Moser Patterson & Sheridan (57) ABSTRACT

Methods and compositions are provided for planarizing a substrate surface with reduced or minimal defects in surface topography. In one aspect, a method is provided for processing a substrate including positioning a substrate comprising at least first dielectric material and second dielectric material disposed thereon in a polishing apparatus, polishing the substrate with a first polishing composition having a first selectivity, and polishing the substrate with a second polishing composition having a second selectivity greater than the first selectivity.

58 Claims, 5 Drawing Sheets

U.S. PATENT DOCUMENTS

| | | | |
|---|---|---|---|
| 5,769,689 A | 6/1998 | Cossaboon et al. | 451/41 |
| 5,770,095 A | 6/1998 | Sasaki et al. | 216/38 |
| 5,795,495 A * | 8/1998 | Meikle | 216/88 |
| 5,817,567 A | 10/1998 | Jang et al. | 438/427 |
| 5,867,757 A | 2/1999 | Okazaki et al. | 399/262 |
| 5,876,508 A | 3/1999 | Wu et al. | 134/2 |
| 5,922,136 A | 7/1999 | Huang | 134/2 |
| 5,922,620 A | 7/1999 | Shimomura et al. | 438/693 |
| 5,932,486 A | 8/1999 | Cook et al. | 438/692 |
| 5,951,724 A | 9/1999 | Hanawa et al. | 51/309 |
| 5,958,794 A | 9/1999 | Bruxvoort et al. | 438/692 |
| 5,968,239 A | 10/1999 | Miyashita et al. | 106/3 |
| 5,981,394 A | 11/1999 | Ohashi et al. | 438/692 |
| 5,981,396 A | 11/1999 | Robinson et al. | 438/692 |
| 5,996,594 A | 12/1999 | Roy et al. | 134/1.3 |
| 5,996,595 A | 12/1999 | Olesen et al. | 134/1.3 |
| 6,019,806 A | 2/2000 | Sees et al. | 51/308 |
| 6,042,741 A | 3/2000 | Hosali et al. | 252/79.1 |
| 6,043,155 A | 3/2000 | Homma et al. | 438/691 |
| 6,046,112 A | 4/2000 | Wang | 438/693 |
| 6,054,379 A | 4/2000 | Yau et al. | 438/623 |
| 6,060,395 A | 5/2000 | Skrovan et al. | 438/692 |
| 6,062,952 A * | 5/2000 | Robinson et al. | 451/41 |
| 6,063,306 A | 5/2000 | Kaufman et al. | 252/79.4 |
| 6,091,131 A | 7/2000 | Cook et al. | 257/629 |
| 6,099,604 A | 8/2000 | Sandhu et al. | 51/307 |
| 6,114,249 A | 9/2000 | Canaperi et al. | 438/692 |
| 6,132,292 A | 10/2000 | Kubo | 451/36 |
| 6,136,218 A | 10/2000 | Skrovan et al. | 252/79.1 |
| 6,143,663 A | 11/2000 | Koutny, Jr. | 438/691 |
| 6,149,830 A | 11/2000 | Li et al. | 216/89 |
| 6,162,368 A | 12/2000 | Li et al. | 216/89 |
| 6,174,814 B1 | 1/2001 | Cook et al. | 438/692 |
| 6,193,790 B1 | 2/2001 | Tani | 106/3 |
| 6,206,756 B1 | 3/2001 | Chopra et al. | 451/28 |
| 6,221,118 B1 | 4/2001 | Yoshida et al. | 51/309 |
| 6,234,875 B1 | 5/2001 | Pendergrass, Jr. | 451/41 |
| 6,258,721 B1 | 7/2001 | Li et al. | 438/693 |
| 6,273,786 B1 | 8/2001 | Chopra et al. | 451/28 |
| 6,276,996 B1 | 8/2001 | Chopra | 451/41 |
| 6,290,580 B1 | 9/2001 | Tanaka et al. | 451/44 |
| 6,294,105 B1 | 9/2001 | Feeney et al. | 252/79.1 |
| 6,316,366 B1 | 11/2001 | Kaufman et al. | 438/693 |
| 6,435,942 B1 * | 8/2002 | Jin et al. | 451/8 |
| 6,468,910 B1 | 10/2002 | Srinivasan et al. | 438/692 |
| 6,670,200 B2 * | 12/2003 | Ushio et al. | 438/14 |
| 2001/0036738 A1 | 11/2001 | Hatanaka et al. | 438/693 |
| 2002/0182982 A1 * | 12/2002 | Li et al. | 451/41 |

FOREIGN PATENT DOCUMENTS

| | | | |
|---|---|---|---|
| WO | 98/49723 | 11/1998 | H01L/21/321 |
| WO | 99 46081 | 9/1999 | B24B/7/22 |
| WO | 00 2235 | 1/2000 | H01L/21/00 |
| WO | 00/30159 | 5/2000 | H01L/21/00 |
| WO | 00/36037 | 6/2000 | C09G/1/02 |
| WO | 00/49687 | 8/2000 | H01L/21/302 |
| WO | 00/56391 | 9/2000 | C09K/3/14 |

* cited by examiner

METHODS AND COMPOSITIONS FOR CHEMICAL MECHANICAL POLISHING SHALLOW TRENCH ISOLATION SUBSTRATES

CROSS-REFERENCE TO RELATED APPLICATIONS

This application claims benefit of U.S. Provisional Patent Application Ser. No. 60/305,721, filed Jul. 16, 2001, and U.S. Provisional Patent Application Ser. No. 60/325,063, filed Sep. 26, 2001, which are incorporated herein by reference.

BACKGROUND OF THE INVENTION

1. Field of the Invention

The invention relates generally to the fabrication of semiconductor devices and to polishing and planarizing of substrates.

2. Description of the Related Art

Reliably producing sub-half micron and smaller features is one of the key technologies for the next generation of very large-scale integration (VLSI) and ultra large-scale integration (ULSI) of semiconductor devices. However, the shrinking dimensions of interconnects in VLSI and ULSI technology has placed additional demands on the processing capabilities. The multilevel interconnects that lie at the heart of this technology require precise processing of high aspect ratio features, such as vias, contacts, lines, and other interconnects. Reliable formation of these interconnects is important to VLSI and ULSI success and to the continued effort to increase circuit density and quality of individual substrates and die.

Multilevel interconnects are formed by the sequential deposition and removal of materials from the substrate surface to form features therein. As layers of materials are sequentially deposited and removed, the uppermost surface of the substrate may become non-planar across its surface and require planarization prior to further processing. Planarizing a surface, or "polishing" a surface, is a process where material is removed from the surface of the substrate to form a generally even, planar surface. Planarization is useful in removing excess deposited material and in removing undesired surface topography and surface defects, such as rough surfaces, agglomerated materials, crystal lattice damage, scratches, and contaminated layers or materials to provide an even surface for subsequent processing.

Chemical mechanical planarization, or chemical mechanical polishing (CMP), is a common technique used to planarize substrates. In conventional CMP techniques, a substrate carrier or polishing head is mounted on a carrier assembly and positioned in contact with a polishing media in a CMP apparatus. The carrier assembly provides a controllable pressure to the substrate urging the substrate against the polishing media. The substrate and polishing media are moved in a relative motion to one another.

A polishing composition is provided to the polishing media to effect chemical activity in removing material from the substrate surface. The polishing composition may contain abrasive material to enhance the mechanical activity between the substrate and polishing media. Thus, the CMP apparatus effects polishing or rubbing movement between the surface of the substrate and the polishing media while dispersing a polishing composition to effect both chemical activity and mechanical activity. The chemical and mechanical activity removes excess deposited materials as well as planarizing a substrate surface.

Chemical mechanical polishing may be used in the fabrication of shallow trench isolation (STI) structures. STI structures that may be used to separate transistors and components of a transistor, such as source/drain junctions or channel stops, on a substrate surface during fabrication. STI structures can be formed by depositing a series of dielectric materials and polishing the substrate surface to remove excess or undesired dielectric materials. An example of a STI structure includes depositing a silicon nitride layer on an oxide layer formed on a silicon substrate surface, patterning and etching the substrate surface to form a feature definition, depositing a silicon oxide fill of the feature definitions, and polishing the substrate surface to remove excess silicon oxide to form a feature. The silicon nitride layer may perform as a hard mask during etching of the features in the substrate and/or as a polishing stop during subsequent polishing processes. Such STI fabrication processes require polishing the silicon oxide layer to the silicon nitride layer with a minimal amount of silicon nitride removed during the polishing process in order to prevent damaging of the underlying materials, such as oxide and silicon.

The STI substrate is typically polished using a conventional polishing media and an abrasive containing polishing slurry. However, polishing STI substrates with conventional polishing pads and abrasive containing polishing slurries has been observed to result in overpolishing of the substrate surface and form recesses in the STI features and other topographical defects such as microscratches on the substrate surface. This phenomenon of overpolishing and forming recesses in the STI features is referred to as dishing. Dishing is highly undesirable because dishing of substrate features may detrimentally affect device fabrication by causing failure of isolation of transistors and transistor components from one another resulting in short-circuits. Additionally, overpolishing of the substrate may also result in nitride loss and exposing the underlying silicon substrate to damage from polishing or chemical activity, which detrimentally affects device quality and performance.

Figure 1A:
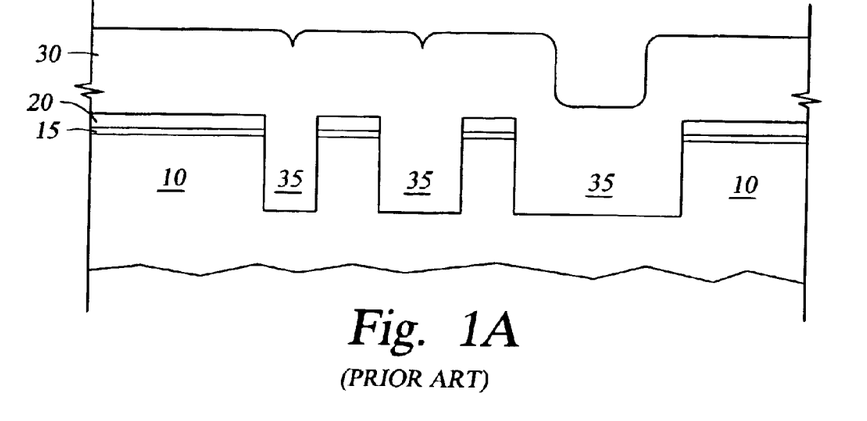
FIGS. 1A–1C are schematic diagrams illustrating the phenomena of dishing and nitride loss.
Figure 1B:
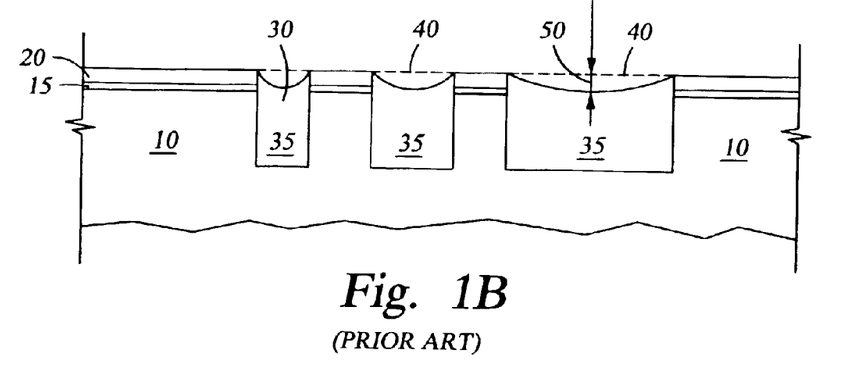
Figure 1C:
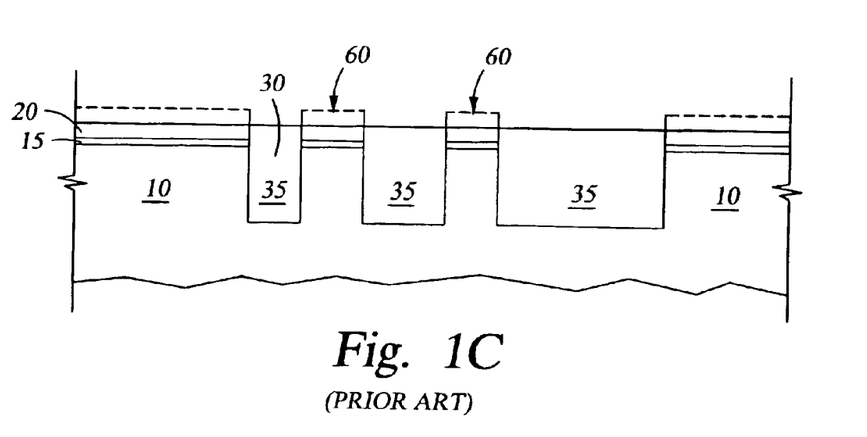

FIGS. 1A–1C are schematic diagrams illustrating the phenomena of dishing and nitride loss. FIG. 1A shows an example of one stage of the STI formation process with a silicon nitride layer 20 and thermal oxide layer 15 disposed and patterned on a substrate 10. A silicon oxide material 30 is deposited on the substrate surface in a sufficient amount to fill features 35.

FIG. 1B illustrates the phenomena of dishing observed with polishing by conventional techniques. During polishing of the silicon oxide material 30 to the silicon nitride layer 20, the silicon oxide material 30 may be overpolished and surface defects, such as recesses 40, may be formed in the silicon oxide material 30. The excess amount of silicon oxide material removed from overpolishing the substrate surface, represented by dashed lines, is considered the amount of dishing 50 of the feature.

FIG. 1C illustrates nitride loss from the surface of the silicon nitride layer 20 from excess polishing of the substrate surface with conventional polishing processes. Silicon nitride loss may take the form of excess removal of silicon nitride, or "thinning" of the silicon nitride layer, from the desired amount 60 of silicon nitride. The silicon nitride loss may render the silicon nitride layer 30 unable to prevent or limit damage to or contamination of the underlying substrate material during polishing or subsequent processing.

One proposed solution to reduce dishing and nitride loss is the use of pressure sensitive slurries, also known as non-Prestonian slurries. Prestonian slurries are broadly defined as slurries that have a removal rate proportional to both the contact pressure between the substrate and platen and the rotational speed of the platen. Non-Prestonian slurries have removal rates that are not proportional to the polishing pressure and the rotational speed. For example, a non-Prestonian slurry may have a linear correlation between removal rate and polishing pressure, but may reach a range of polishing pressures, typically at decreasing polishing pressures, which results in no noticeable removal of material from the substrate surface.

Figure 2:
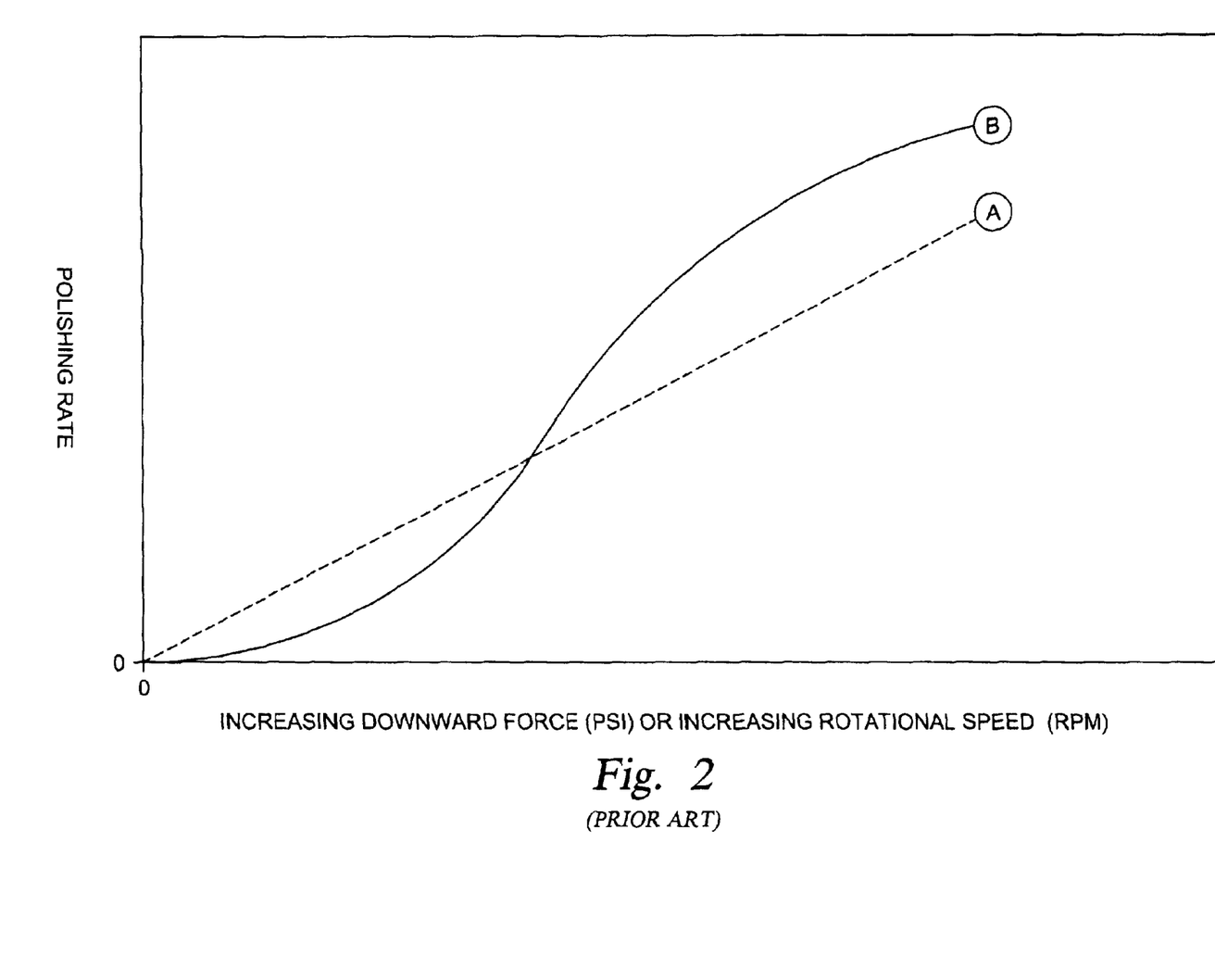
FIG. 2 is graph showing the polishing rate versus downward force or RPMs of a Prestonian slurry and non-Prestonian slurry.

FIG. 2 shows a comparison between Prestonian slurry A, typically a conventional polishing slurry, and non-Prestonian slurry B. The Prestonian slurry A is shown with a polishing rate having a constant linear slope or removal rate versus polishing pressure (or rotational speed), while the non-Prestonian slurry B has a polishing rate with a variable linear slope during increasing polishing pressure. For example, in FIG. 1, the slope for Slurry B, has a first portion of a relatively consistent initial removal rate followed by a second portion of increasing removal rate with increasing polishing pressure, which then returns to a relatively consistent removal rate with further application of increasing polishing pressure.

It has been observed that the non-Prestonian slurries are insensitive to overpolishing and exhibit reduced or minimal dishing or nitride loss of substrate features. However, non-Prestonian slurries are often more expensive than Prestonian slurries and have relatively low polishing rates compared to Prestonian slurries, which result in increased production costs and reduced substrate throughput. Additionally, non-Prestonian slurries often produce substrate surfaces with more than a desirable number of microscratches and other topographical defects formed in the substrate surface. Microscratches are indentations formed in the substrate surfaces that are approximately 0.5 micron wide, 0.1 micron deep and from 10 to 50 microns in length. Microscratches can be detrimental to subsequent polishing processes and detrimentally affect process device yield, and thus, are highly undesirable.

Therefore, there exists a need for a method and polishing composition that facilitates the removal of dielectric materials with minimal or reduced defect formation during polishing of a substrate surface.

SUMMARY OF THE INVENTION

Aspects of the invention generally provide a method and composition for planarizing a substrate surface with reduced or minimal defects in surface topography and reduced processing times. In one aspect, a method is provided for processing a substrate including positioning a substrate comprising at least first dielectric material and second dielectric material disposed thereon in a polishing apparatus having polishing media disposed thereon, polishing the substrate with a first polishing composition having a first selectivity, and polishing the substrate with a second polishing composition having a second selectivity greater than the first selectivity.

In another aspect, a method is provided for processing a substrate including positioning a substrate comprising at least first dielectric material and second dielectric material disposed thereon in a polishing apparatus having polishing media disposed thereon, polishing the substrate with a first polishing composition having a first selectivity, and polishing the substrate with a second polishing composition having a second selectivity less than the first selectivity.

In another aspect, a method for processing a substrate is provided including providing a substrate having at least first dielectric material and second dielectric material disposed thereon in a polishing apparatus, polishing the substrate on a first platen with a first polishing composition comprising a removal rate ratio of the first dielectric material and the second dielectric material between about 1:1 and about 5:1, polishing the substrate on a second platen with a second polishing composition, and polishing the substrate on a third platen with a third polishing composition comprising a removal rate ratio of the first dielectric material and the second dielectric material of about 30:1 or greater.

In another aspect, a method is provided for processing a substrate including providing a substrate having at least first dielectric material and second dielectric material disposed thereon in a polishing apparatus, polishing the substrate on a first platen with a first polishing composition comprising a removal rate ratio of the first dielectric material and the second dielectric material of about 30:1 or greater, polishing the substrate on a second platen with a second polishing composition, and polishing the substrate on a third platen with a third polishing composition comprising a removal rate ratio of the first dielectric material and the second dielectric material between about 1:1 and about 5:1.

BRIEF DESCRIPTION OF THE DRAWINGS

So that the manner in which the above recited aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

In general, aspects of the invention provide compositions and methods for planarizing a substrate surface with reduced or minimal defects in surface topography. The invention will be described below in reference to a planarizing process for the removal of dielectric material, such as silicon containing materials, from a substrate surface by chemical mechanical planarization, or chemical mechanical polishing (CMP) technique. Chemical mechanical polishing is broadly defined herein as polishing a substrate by a combination of chemical and mechanical activity.

The planarizing process and composition that can used to polish a substrate disposed in chemical mechanical polishing process equipment, such as the Mirra® polishing system, the Mirra® Mesa™ polishing system, and the Reflexion™ polishing system, all of which are available from Applied Materials, Inc. The Mirra® polishing system is further described in U.S. Pat. No. 5,738,574, entitled, "Continuous Processing System for Chemical Mechanical Polishing," the entirety of which is incorporated herein by reference to the extent not inconsistent with the invention.

Although, the processes and compositions described herein are illustrated utilizing a three platen system, such as the Mirra® polishing system, any system enabling chemical mechanical polishing, using the composition or processes described herein can be used to advantage. Examples of other suitable apparatus include orbital polishing systems, such as the Obsidian 8200C System available from Applied Materials, Inc., or a linear polishing system, using a sliding or circulating polishing belt or similar device. An example of a linear polishing system is more fully described in co-pending U.S. patent application Ser. No. 09/244,456, filed on Feb. 4, 1999, and incorporated herein by reference to the extent not inconsistent with the invention.

Chemical Mechanical Polishing Process

Aspects of the invention provide polishing methods and compositions to planarize a substrate surface with reduced or minimal topographical defect formation during a polishing process for dielectric materials. Generally, a method is provided for processing a substrate including positioning a substrate comprising at least first dielectric material and second dielectric material disposed thereon in a polishing apparatus having polishing media disposed thereon, polishing the substrate with a first polishing composition having a first selectivity, and polishing the substrate with a second polishing composition having a second selectivity different than the first selectivity.

Aspects of the invention also provide polishing methods and compositions to planarize a substrate surface with reduced or minimal topographical defect formation, such as microscratch formation, during a polishing process for dielectric materials. The aspects may be achieved by a method include polishing the substrate with a first polishing composition comprising a first concentration of abrasive solution and a first concentration of additives and polishing the substrate with a second polishing composition comprising the first polishing composition diluted with a solvent, such as deionized water, additives, or combinations thereof.

Selectivity is broadly defined herein as the preferential removal of one material in comparison to another material and typically denoted as a removal rate ratio between a first material and second, or subsequent, materials. Bulk dielectric material is broadly described herein as dielectric material deposited on the substrate in an amount more than sufficient to substantially fill features formed on the substrate surface. Bulk dielectric material includes, but is not limited to, silicon oxide.

Residual dielectric material is broadly defined as any bulk dielectric material remaining after one or more polishing process steps as well as the residue of any additional materials from layers disposed below the bulk dielectric material. Residual conductive material may partially or completely cover the surface a substrate. For example, residual material may cover about 25% or less of the surface area of the substrate. Residual material is generally present in an amount covering between about 5% and about 10% of the surface area of a substrate after one or more polishing process steps.

In one aspect, a method is provided for processing a substrate including positioning a substrate comprising at least first dielectric material and second dielectric material disposed thereon in a polishing apparatus having polishing media disposed thereon, polishing the substrate with a first polishing composition having a first selectivity, and polishing the substrate with a second polishing composition having a second selectivity greater than the first selectivity. Alternatively, the substrate may be polished with the first polishing composition having the first selectivity and then polished with the second polishing composition having a second selectivity less than the first selectivity. Further, the first and second polishing compositions may be used in one or more steps, which can include a second polishing step of either the first or second polishing composition with a diluted version, respectively. Each polishing step may be performed on a separate platen or multiple steps may be performed on the same platen.

Selective Polishing Compositions

The polishing steps described herein may use both low selectivity compositions or slurries (LSS) and high selectivity compositions or slurries (HSS) to remove bulk and residual dielectric material, such as silicon oxide, from the substrate surface, which may have a second dielectric material disposed thereon such as silicon nitride. The low selectivity compositions and the high selectivity compositions may be Prestonian or non-Prestonian compositions.

Low selectivity compositions may have a selectivity of silicon oxide to silicon nitride between about 1:1 and about 5:1, such as between about 3:1 and about 4:1. Generally, the low selectivity polishing compositions include an abrasive solution, a basic compound, such as ammonia or potassium hydroxide, and deionized water.

The low selectivity polishing composition includes between about 10 weight percent (wt. %) and about 30 wt. % of an abrasive solution. The abrasive solutions may contain between about 10 weight percent (wt. %) and about 30 wt. % of silica abrasive particles or between about 0.5 weight percent (wt. %) and about 5 wt. % of ceria abrasive particles. An example of an abrasive particle is ceria with a particle size of about 300 nm or less in size.

Examples of the low selectivity polishing compositions include SS-12 (about 12 wt. % abrasive silica particles) and SS-25 (about 25 wt. % abrasive silica particles), commercially available from Cabot Corp. of Aurora, Ill. and Klebosol, from Rodel Inc., of Phoenix, Ariz.

The low selectivity composition may also be diluted prior to use in polishing processes. For example, an abrasive solution containing 5 wt. % ceria may be diluted to provide about 0.2 wt. % of abrasive particles in the polishing composition. Another example of an abrasive solution is HS-8005, a ceria containing slurry, commercially available from Hitachi Chemical Co. Ltd., of Japan.

High selectivity polishing compositions generally have a selectivity of silicon oxide to silicon nitride of greater than about 5:1, and preferably have a selectivity of about 30:1 or greater, such as between about 30:1 and about 50:1. The high selectivity compositions may include compositions having abrasive solutions, additives, and solvent. The abrasive solutions, additives, and solvent may be a ratio of X:Y:Z, with X=1 to 20, Y=0 to 20, and Z=0 to 20. Examples of high selectivity compositions having the ratio include 1:2.2:0, 1:11:8, 1:6:3, and 1:12:7. The abrasive materials may be present in the high selectivity composition as described for the low selectivity compounds described herein.

High selective polishing compositions may be formed by having additives combined or mixed with abrasive solutions to form the. The additives typically comprise compounds that suppress polishing of the substrate surface to control the removal rate of oxide materials. Examples of additives include surfactants, such as polycarboxylate compounds. For example, polycarboxylate-based additives may be used to inhibit polishing and lower removal rates. An example of a suitable additive in a solution for use with the abrasive includes 8103GPE or 8102GP, commercially available from Hitachi Chemical Co. Ltd., of Japan. It is believed that additives as described herein suppress the removal rate of dielectric materials, such as silicon oxide and silicon nitride, and can be selected to selectively suppress removal of a particular material, such as silicon nitride, to provide the desired selectivity.

The ratio of abrasive solutions to additives is generally between about 1:1 and about 1:3, which is approximate to an abrasive solution concentration between about 30 volume percent (vol %) and about 50 vol % of the high selectivity polishing composition. The abrasive solution concentration may be considered equivalent to between about 30 weight percent (wt. %) and about 50 wt. %. A ratio of abrasive solution to additives of about 1:2.2 has been observed to be effective in selectively removing bulk and residual dielectric material from the surface of a substrate.

The solvent may be any suitable solvent for a polishing composition, of which water, such as deionized water, is used. The solvent and/or additive compounds may be used to dilute the high selectivity polishing compositions to have an abrasive solution concentration of about 50% or less of the initial composition. Dilution of the abrasive solution concentration allows for further reducing the formation of topographical defects, such as microscratches, during polishing.

The diluted high selectivity composition may have an abrasive solution concentration of about 50% or less of the first polishing composition. The diluted high selectivity composition may be formed without the presence of an additive component for a composition containing an abrasive solution and deionized water only. When the diluted high selectivity composition includes an additive, the additive may be present in the second polishing composition in a greater concentration than the concentration of the abrasive solution. The diluted high selectivity compositions may have a decreased removal rate and selectivity compared to undiluted composition, but will generally have removal rates and selectivity greater than low selectivity compositions.

Deionized water may comprise between about 25 volume percent (vol %) and about 90 vol % of the diluted high selectivity polishing composition. For example, a diluted high selectivity polishing composition having a ratio of about 1:11:8 of abrasive solution, additive, and deionized water, i.e., a deionized water content of about 40% volume, has been observed to polish the substrate surface with reduced microscratch formation compared to the first polishing composition. A post-dilution deionized water volume between about 25 vol % and about 50 vol % may be used for the diluted high selectivity polishing composition.

Typically, the abrasive solution concentration of the diluted high selectivity polishing composition is about 50% or less than the base high selectivity polishing composition. For example, depending upon the amount of additive in the diluted high selectivity polishing composition, the abrasive solution may comprise between about 1 vol % and about 20 vol % of the high selectivity polishing composition. An abrasive solution content between 5 vol % and about 15 vol % may be used in the second polishing composition. In diluted high selectivity polishing compositions containing additives, the additives are present in an amount between about 10 vol % and about 60 vol %.

For example, in a ratio of about 1:0:9 of abrasive solution, additive, and deionized water, the abrasive solution content of the composition is about 10% by volume and is additive free. Also, for example, in a ratio of about 1:11:8 of abrasive solution, additive, and deionized water, the abrasive solution content of the composition comprises about 5% by volume and the additive comprises about 55% by volume.

Alternatively, the low selectivity compositions may also be diluted with a solvent, such as water, as described for the high selectivity solutions described herein. For example, a low selective slurry of about 1:0:9 of abrasive solution, additive, and deionized water may be used. Similarly, low selectivity composition may used herein as described for high selectivity compositions in reducing microscratch formation.

Processing Embodiments

The high selectivity compositions and low selectivity compositions may be used in multiple techniques to provide effective polishing with reduced defect formation.

For two platen processing, a polishing method may include positioning a substrate comprising at least first dielectric material and second dielectric material disposed thereon in a polishing apparatus, polishing the substrate with a first polishing composition having a first selectivity, and polishing the substrate with a second polishing composition having a second selectivity different than the first selectivity. One example is a two-step polishing process having a first polishing step using a first polishing composition having a low selectivity for removing bulk material and then a second polishing step using a second polishing composition having a high selectivity for removing residual material.

Alternatively, a two-step polishing process having a first polishing step using a first polishing composition having a high selectivity for removing bulk material and then a second polishing step using a second polishing composition having a low selectivity for removing residual material may be used. The high selectivity polishing described for the above embodiments may be performed with first the base high selectivity composition and then the diluted composition as described herein, and which base and diluted composition polishing may be performed on the same or separate platens.

For a three platen polishing process, a first polishing composition having a first selectivity, such as the low selectivity polishing composition described herein, is used to polish the substrate surface to remove a bulk portion of the first dielectric layer on the first platen, a second polishing composition having a second selectivity greater than the first selectivity, such as the high selectivity polishing composition described herein, is used to polish the substrate on a second platen, and a third polishing composition having a selectivity greater than the first selectivity, such as the high selectivity polishing composition described herein, is used to polish the substrate on a third platen to remove residual materials. The third polishing composition may include the diluted high selectivity polishing composition described herein. Alternatively, the above process may be performed with the low and high selectivity compositions being interchanged.

In a further embodiment, a first polishing composition having a first selectivity, such as the low selectivity polishing composition described herein, is used to polish the substrate surface to remove a bulk portion of the first dielectric layer on the first platen, a second polishing composition having a second selectivity of about the first selectivity, such as the low selectivity polishing composition described herein, is used to polish the substrate on a second platen, and a third polishing composition having a third selectivity greater than the first selectivity, such as the high selectivity polishing composition described herein, is used to polish the substrate on a third platen to remove residual materials. The second low selectivity polishing composition may contain a lower abrasive solution concentration than the first low selectivity polishing composition. For example, SS-25, containing about 25 wt. % abrasive silica particles, may comprise the first low selectivity polishing composition and SS-12, containing about 12 wt. % abrasive silica particles, may comprise the second low selectivity polishing composition.

Alternatively, the above process may be performed with the low and high selectivity compositions being interchanged. The high selectivity polishing described for the above embodiments may be performed with first the base high selectivity composition and then the diluted composition as described herein, and which base and diluted composition polishing may be performed on the same or separate platens.

Demonstrative Process

Substrates that may be polished by the process described herein may include shallow trench isolation structures formed in a series of dielectric layers, such as silicon oxide disposed over a silicon nitride barrier layer as shown in FIG. 1. The invention contemplates polishing dielectric materials conventionally employed in the manufacture of semiconductor devices, for example, silicon dioxide, silicon nitride, phosphorus-doped silicon glass (PSG), boron-phosphorus-doped silicon glass (BPSG), and silicon dioxide derived from tetraethyl orthosilicate (TEOS), high density plasma chemical vapor deposition (HDP-CVD) silicon oxides (HDP oxides), silane by plasma enhanced chemical vapor deposition (PECVD) can be employed, and combinations thereof.

In one example, a method of planarizing a substrate surface with reduced topographical defect formation is provided as follows. A substrate having at least a first dielectric material deposited on a second dielectric material is provided to a polishing apparatus having a first polishing platen containing a conventional, or abrasive-free, polishing media disposed thereon. The first dielectric material may include silicon oxide deposited to a thickness between about 1000 Å and about 10,000 Å, such as between about 1000 Å and about 6000 Å. The second dielectric material is silicon nitride and is usually deposited to a thickness between about 200 Å and about 2000 Å, such as about 1000 Å. The second dielectric material may be deposited on an oxide layer having a thickness between about 50 Å and about 200 Å, such as about 100 Å.

The substrate is polished with a first polishing composition having a first selectivity on a first platen to remove bulk dielectric material and polished with a second polishing composition having a second selectivity different than the first selectivity on a second platen, such as a second selectivity greater than the first selectivity, to remove residual bulk dielectric material.

In one embodiment, the substrate is polished with a low selectivity composition followed by a high selectivity composition with the bulk material being removed using a low selectivity polishing composition. Generally, the low selectivity polishing composition will remove dielectric material at a selectivity of silicon oxide to silicon nitride between about 1:1 and about 5:1, such as between about 3:1 and about 4:1.

The polishing step including the low selectivity polishing composition typically comprises polishing the substrate between 1 psi and about 10 psi, such as between about 2 psi and about 8 psi, for example between about 3 psi and about 5 psi, at a carrier head rotational rate and platen rotational rate between about 20 rpms and about 200 rpms, such as between about 50 rpms and about 120 rpms, for example 73 rpms for the carrier head rotational speed and about 77 rpms for platen rotational speed, for between about 30 and about 240 seconds. The low selectivity polishing composition is delivered to a polishing pad at a flow rate of about 150 ml/min or greater. However, processing parameters such as rotational speed, duration, and polishing pressure, will vary based upon the material used and operator requirements.

An example of the low selectivity polishing step includes supplying a composition of SS-12 with a slurry delivery rate of about 200 ml/min and then removing bulk silicon oxide material from the substrate surface by polishing the substrate at a polishing pressure of about 4 psi with a platen rotational speed of about 77 rpms and a carrier head rotational speed of about 73 rpms for approximately 90 seconds.

Additionally, the low selectivity polishing compositions may be used in conjunction with hard polishing pads during polishing processes. A hard polishing material is broadly described herein as a polishing material having a polishing surface of a hardness of about 50 or greater on the Shore D Hardness scale for polymeric materials as described and measured by the American Society for Testing and Materials (ASTM), headquartered in Philadelphia, Pa. The hard polishing pad may include a polymeric material, i.e., plastic, or foam, such as polyurethane or polyurethane mixed with a filler material. Examples of hard polishing pads includes the IC-1000 and IC-1010 polishing pad from Rodel Inc., of Phoenix, Ariz.

Polishing the substrate with a second selectivity greater than the first selectivity is achieved by polishing the substrate with a high selectivity polishing composition. The polishing step for high selectivity polishing compositions provides for removal of any remaining bulk material or residual material from the substrate surface. Generally, the high selectivity polishing compositions produced herein are selective in removing silicon oxide dielectric material over other dielectric material, such as silicon nitride, by a ratio greater than about 5:1, and preferably about 30:1 or greater. For example, a polishing composition having a silicon oxide to silicon nitride removal rate ratio of between about 30:1 and about 50:1 may be used in this process. In one aspect, the slurry solution and the additive solutions comprise a non-Prestonian fluid.

The high selectivity compositions for removal of residual bulk material from the substrate surface include abrasive solution and additives, for example, a ceria containing slurry of HS-8005, and 8103GPE or 8102GP as the additive.

The high selectivity polishing composition is used to polish the substrate at a polishing pressure between 1 psi and about 10 psi, such as between about 2 psi and about 8 psi, at a carrier head rotational rate and a platen rotational rate between about 20 rpms and about 200 rpms, such as between about 50 rpms and about 120 rpms, for example 77 rpms for the carrier head rotational speed and about 73 rpms for platen rotational speed, for between about 30 and about 240 seconds. The high selectivity polishing composition is delivered to a polishing pad at a flow rate of about 150 ml/min or greater. However, processing parameters such as rotational speed, duration, and polishing pressure, will vary based upon the material used and operator requirements.

An example of the high selectivity polishing step includes supplying a composition having a ratio of about 1:11:8 of HS-8005 (abrasive solution), 8103GPE (additive), and deionized water, with a slurry delivery rate of about 200 ml/min and then removing silicon oxide material from the substrate surface by polishing the substrate at a polishing pressure of about 4 psi with a platen rotational speed of about 77 rpms and a carrier head rotational speed of about 73 rpms for approximately 90 seconds.

The high selectivity composition polishing may also be a two-step polishing process with a first high selective polishing step using a high selectivity composition followed by a second high selective polishing step using a diluted high selectivity composition as described herein.

The diluted high selective slurry is generally diluted with a solvent, such as water, which may comprise between about 25 volume percent (vol %) and about 90 vol % of the diluted composition, and abrasive solution, which may comprise between about 1 vol % and about 20 vol % of the solution. Optionally, additives may be included in the composition in an amount between about 10 vol % and about 60 vol % of the second polishing composition. The diluted high selective polishing step typically comprises polishing the substrate between 1 psi and about 10 psi at a carrier head rotational rate between about 20 rpms and about 200 rpms for between about 30 and about 120 seconds. The second polishing composition is delivered at a flow rate of about 150 ml/min or greater. However, processing parameters such as rotational speed, duration, and polishing pressure, will vary based upon the material used and operator requirements.

An example of the two-step high selective polishing process includes supplying a composition that comprises a 1:2.2 ratio of HS-8005 to 8103GPE with a slurry delivery rate of about 200 ml/min at about 4 psi and 77 rpms for approximately 90 seconds to remove silicon oxide material, and then, removing the remaining bulk silicon oxide material from the substrate surface by supplying a composition that comprises a 1:11:8 ratio of HS-8005 to 8103GPE to deionized water with a slurry delivery rate of about 200 ml/min and then polishing the substrate at about 4 psi and 77 rpms for approximately 60 seconds.

Additionally, the high selectivity polishing compositions may be used in conjunction with hard or soft polishing pads during polishing processes. Soft polishing pads have the ability to flex and mold around irregular surfaces of a substrate surface. A material having a hardness between about 25 and about 40 on the Shore D Hardness scale for polymeric materials may be used for the soft polishing pad. Examples of soft polishing pads include a uniformly compressible material including a polymeric material, i.e., plastic, and/or foam, felt, rubber, or a combination thereof, such as polyurethane impregnated with felt. One polishing pad material suitable for the soft polishing material comprises the Politex or Suba series, i.e., Suba IV, of polishing pads available from Rodel, Inc. (IC-1000, IC-1010, Politex, and Suba are tradenames of Rodel Inc.)

Additionally, each polishing step may be followed with a pad and substrate rinse using deionized water. The high selectivity polishing step may also include a finishing step of deionized water polish at 2 psi for 15 seconds, a second polishing composition polish at 2 psi for 5 seconds, or a second polishing composition polish at 2 psi for 5 seconds followed by a deionized water polish at 2 psi for 10 seconds. Further, the substrate may be cleaned by polishing the substrate with a soft polishing pad, such as a Politex pad, using deionized water, following polishing of the substrate by a high selectivity polishing process.

Polishing Examples:

A multi-step high selective polishing process described herein was performed as follows on a STI substrate comprising a patterned oxide layer of about 100 Å, a silicon nitride layer of about 1000 Å disposed on the oxide layer, and a silicon oxide fill layer of 6000 Å thick deposited on the silicon nitride layer.

The substrate was positioned on a first polishing platen having a IC-1010 polishing pad disposed thereon. A composition of SS-12 with a slurry delivery rate of about 200 ml/min was supplied to the platen. The polishing pad and substrate were contacted at a polishing pressure of about 4 psi with a platen rotational speed of about 77 rpms and a carrier head rotational speed of about 73 rpms for approximately 30 seconds to remove bulk oxide material.

The substrate was positioned on a second polishing platen. A composition having a ratio of about 1:11:8 of HS-8005 (abrasive solution), 8103GPE (additive), and deionized water, with a slurry delivery rate of about 200 ml/min was supplied to the platen. The polishing pad and substrate were contacted at a polishing pressure of about 4 psi with a platen rotational speed of about 77 rpms and a carrier head rotational speed of about 73 rpms for approximately 75 seconds to remove residual oxide material. The polishing substrate was then rinsed and examined. The substrate was observed to have minimal topographical defects, such as microscratches, with reduced or minimal dishing and nitride loss.

A second example using a high selectivity composition having a ratio of about 1:2.2 of HS-8005 (abrasive solution) to 8103GPE (additive) was used on the second polishing platen and the substrate was polished for 60 seconds. This substrate was also observed to have comparable results regarding minimal topographical defects and dishing and nitride loss with the 1:11:8 slurry in the first example.

In a third example, the STI substrate was positioned on a first polishing platen having an IC-1010 polishing pad disposed thereon. A composition of SS-12 with a slurry delivery rate of about 200 ml/min was supplied to the platen. The polishing pad and substrate were contacted at a polishing pressure of about 4 psi with a platen rotational speed of about 77 rpms and a carrier head rotational speed of about 73 rpms for approximately 30 seconds to remove bulk oxide material.

The substrate was positioned on a second polishing platen. A composition having a ratio of about 1:11:8 of HS-8005 (abrasive solution), 8103GPE (additive), and deionized water, with a slurry delivery rate of about 200 ml/min was supplied to the platen. The polishing pad and substrate were contacted at a polishing pressure of about 4 psi with a platen rotational speed of about 77 rpms and a carrier head rotational speed of about 73 rpms for approximately 38 seconds. Alternatively, a composition having a ratio of about 1:2.2 of HS-8005 (abrasive solution) to 8103GPE (additive) was used.

The substrate was positioned on a third polishing platen. A composition having a ratio of about 1:11:8 of HS-8005 (abrasive solution), 8103GPE (additive), and deionized water, with a slurry delivery rate of about 200 ml/min was supplied to the platen. The polishing pad and substrate were contacted at a polishing pressure of about 4 psi with a platen rotational speed of about 77 rpms and a carrier head rotational speed of about 73 rpms for approximately 38 seconds to remove residual oxide material. The polishing substrate was then rinsed and examined. The substrate was observed to have minimal topographical defects with reduced or minimal dishing and nitride loss.

In a fourth example, the STI substrate was positioned on a first polishing platen having an IC-1010 polishing pad disposed thereon. A composition of SS-12 (or SS-25) with a slurry delivery rate of about 200 ml/min was supplied to the platen. The polishing pad and substrate were contacted at a polishing pressure of about 4 psi with a platen rotational speed of about 77 rpms and a carrier head rotational speed of about 73 rpms for approximately 15–30 seconds to remove bulk oxide material.

The substrate was positioned on a second polishing platen. A composition of SS-12 (or SS-25) with a slurry delivery rate of about 200 ml/min was supplied to the platen. The polishing pad and substrate were contacted at a polishing pressure of about 4 psi with a platen rotational speed of about 77 rpms and a carrier head rotational speed of about 73 rpms for approximately 15–30 seconds for additional removal of bulk oxide material.

The substrate was positioned on a third polishing platen. A composition having a ratio of about 1:11:8 of HS-8005 (abrasive solution), 8103GPE (additive), and deionized water, with a slurry delivery rate of about 200 ml/min was supplied to the platen. The polishing pad and substrate were contacted at a polishing pressure of about 4 psi with a platen rotational speed of about 77 rpms and a carrier head rotational speed of about 73 rpms for approximately 38 seconds to remove residual oxide material. The polishing substrate was then rinsed and examined. The substrate was observed to have minimal topographical defects with reduced or minimal dishing and nitride loss.

High Selectivity Two-Step Polishing Examples

A series of two platen polishing processes were performed according to the high selective two-step polishing process described above at varying concentrations of abrasive solution, additives, and water (deionized) and was analyzed for defects. Table I shows the composition ratios and defect results for those compositions. The primary polishing step was still performed using a ratio of 1:2.2:0 on platens 1 and 2. A final polishing step, using diluted slurry, followed on platen 3.

Table I. Slurry Dilution Experiments

TABLE I

Slurry Dilution Experiments

| Slurry ratio on platens 1 and 2 | Slurry ratio on platen 3 | Average polish time (s) | Average oxide Thickness (Å) | Micro-Scratches observed. |
|---|---|---|---|---|
| 1:2.2:0 | N/A | 219 | 3388 | 116 |
| 1:2.2:0 | 1:2.2:0 | 189 | 3502 | 100 |
| 1:2.2:0 | 1.5:6:2.5 | 267 | 3280 | 85 |
| 1:2.2:0 | 1:6:3 | 176 | 3487 | 27 |
| 1:2.2:0 | 1:4.5:4.5 | 172 | 3264 | 28 |
| 1:2.2:0 | 1:1.5:7.5 | 184 | 3370 | 27 |
| 1:2.2:0 | 1:0:9 | 153 | 3269 | 28 |
| 1:2.2:0 | 1:11:8 | 217 | 3516 | 11 |

Figure 3:
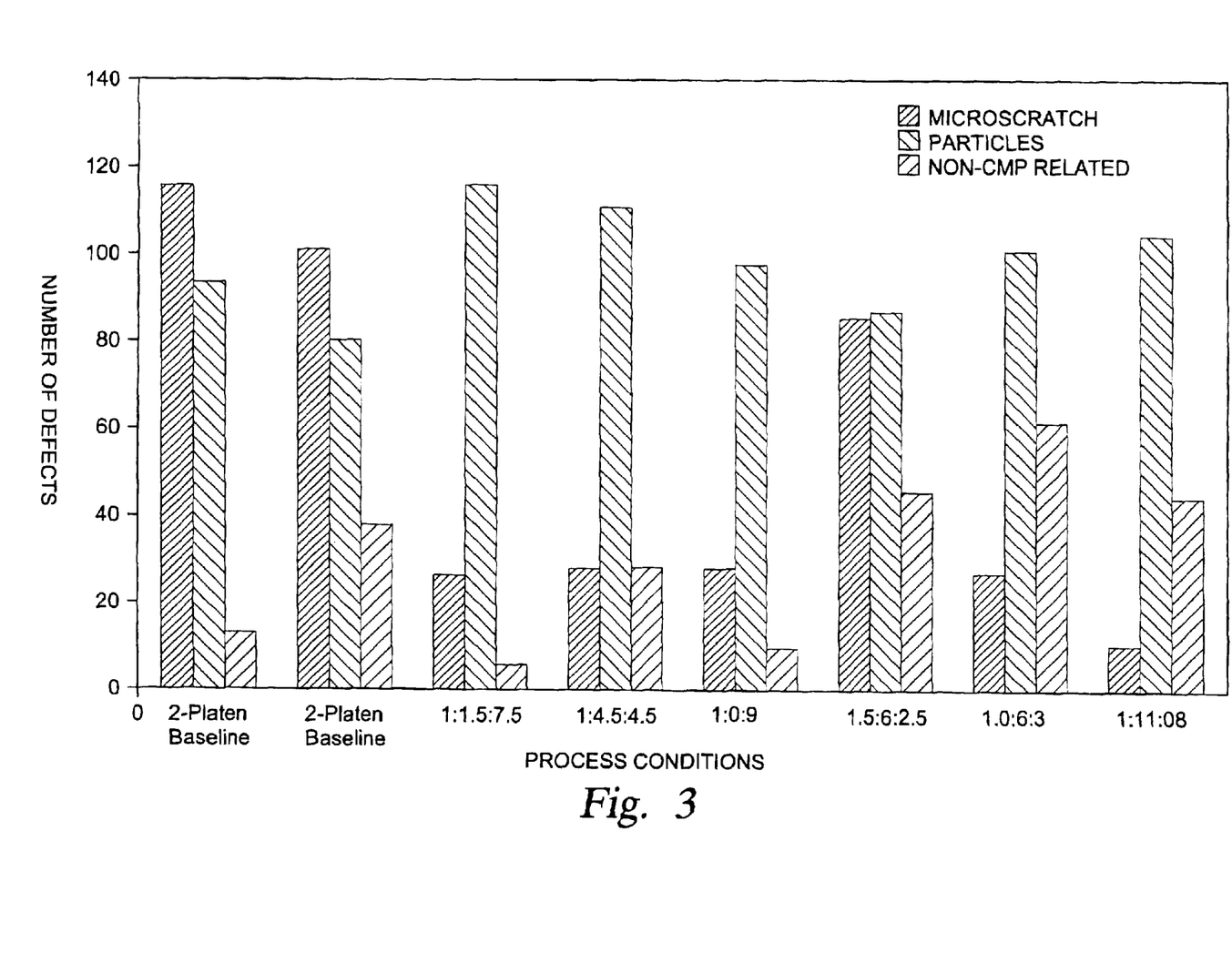
FIG. 3 is a bar graph illustrating component ratios versus defect detected.

The best process was selected by taking into consideration the process performance and microscratch levels. The data in Table I indicates that the lowest number of microscratches (11) was achieved using a ratio of 1:11:8, and this reduction was accomplished without compromise to the range of average thickness for a substrate (WIW) or to the range of average measured film thickness within a die (WID). Results from the dilution experiments are also illustrated graphically in FIG. 3.

In an alternative embodiment, the bulk dielectric material is removed in a two step process including providing the substrate to a first platen to remove a portion of the bulk material with the first polishing composition, providing the substrate to a second platen for removal of a second portion of the bulk material, and providing the substrate to a third platen for removal of the residual bulk material. While not normally desired, the final polishing step of a two platen process and a third platen process may remove a portion of the underlying dielectric, such as silicon nitride, to planarize the surface.

Figure 4:
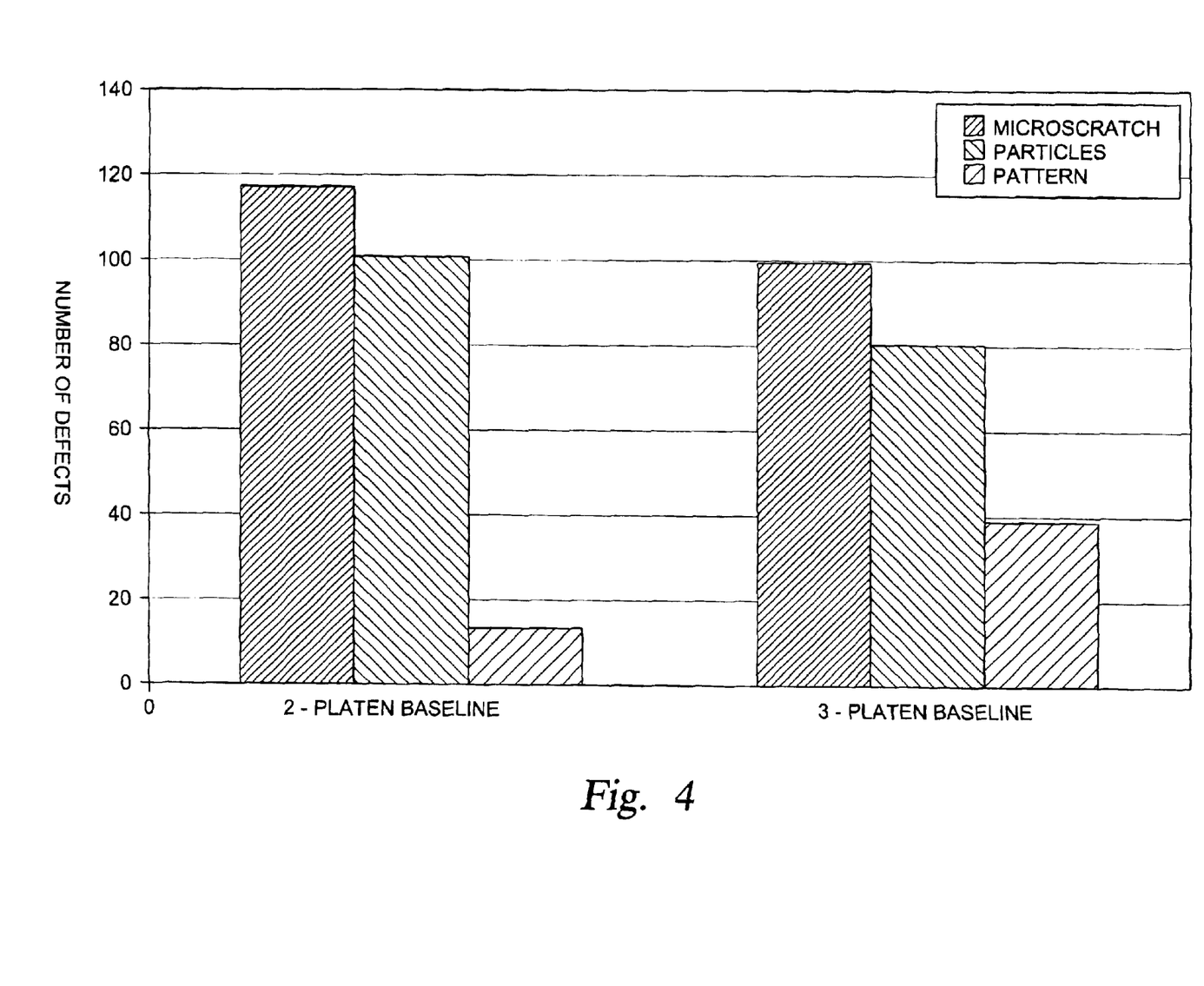
FIG. 4 is a bar graph illustrating number of platens used in polishing the substrates versus defects detected.

A comparison of two platen and three platen polishing processes was performed. The two platen polishing process and the three platen polishing process use a baseline process with a slurry ratio of 1:2.2:0 of abrasive solution, additive, and deionized water, at 200 ml/min and 4 psi. For the two platen process, substrates were typically polished on platen 1 for an average time of 90 seconds and then on platen 2 between about 110 and about 130 seconds. The endpoint for the polish on platen 2 was determined using ISRM. The main polish step on platen 2 was followed by an overpolish step of about 10 seconds at 2 psi which in turn was followed by pad-rinse and substrate-rinse. For the three platen process, the substrates were polished for an average time between about 75 and about 80 seconds at 4 psi on each of platens 1 and 2 and then between about 50 and about 60 seconds on platen 3 at 4 psi. A decrease in microscratches between the two and three platen for the substrates resulted in microscratch levels of 116 and 100, respectively, was observed. FIG. 4 illustrates the defect performance of the two and three platen process.

In an alternative embodiment, reduced microscratch formation may be enhanced by reducing the polishing time of the second polishing step, optionally, with a decreased downforce. A two platen process described above was used with the second polishing step having a low down force, a low rotating speed, or a combination of both. For the two platen process, substrates were typically polished on platen 1 for an average time of 90 seconds and then on platen 2 between about 110 and about 130 seconds. The endpoint for the polishing on platen 2 was determined using ISRM. The main polish step on platen 2 was followed by an overpolish step of about 10 seconds at 2 psi that in turn was followed by pad-rinse and substrate-rinse. The results are shown in Table II below.

Table II. Conditioning Experiment

TABLE II

Conditioning Experiment

| Experiment | Down Force (lbf) | Speed (rpm) | Time (sec) | MS | Cleared Nitride |
|---|---|---|---|---|---|
| 2-platen baseline | 6 | 79 | By Polish | 116 | Yes |
| Low Down Force | 3 | 79 | By Polish | 63 | Yes |
| Low Down Force, Low Speed | 3 | 50 | By Polish | 98 | Yes |
| Reduced Polishing/ Conditioning Time | 6 | 79 | 24 | 58 | No |
| Low Down Force, Reduced Polishing/ Conditioning Time, High Speed | 3 | 150 | 24 | 93 | No |

Figure 5:
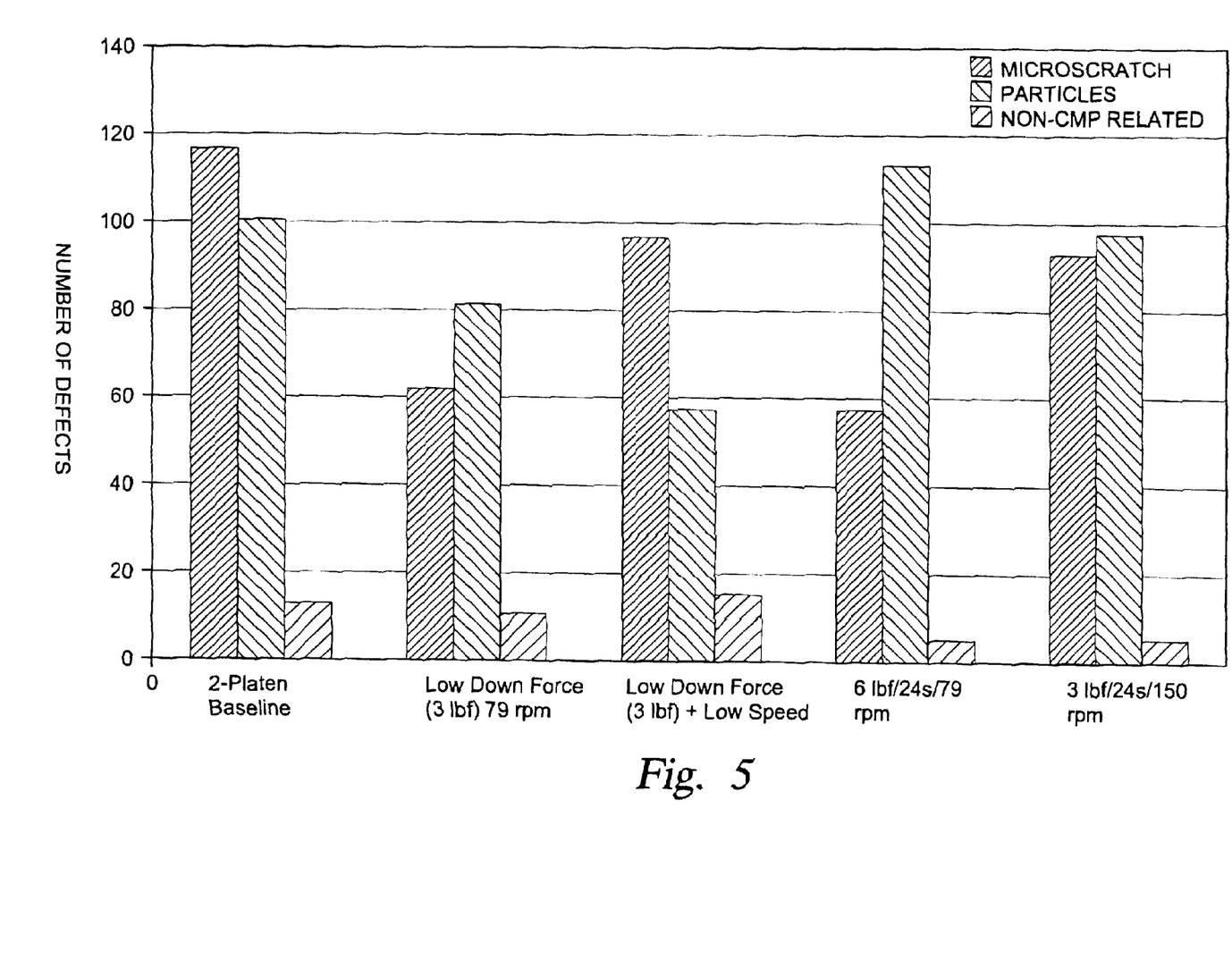
FIG. 5 is a bar graph illustrating varying process conditions versus defects detected.

The Table II and accompanying FIG. 5 illustrate that some improvement occurred with low down force and shorter conditioning times compared to a standard two platen process. A reduced microscratch level by almost 50% was observed in some instances.

Generally, it is believed that increased microscratches formation occurs when polishing the silicon oxide and silicon nitride interface, and that a reduction on polishing time at or near the interface, i.e., reduced or minimal overpolishing at the interface to remove residual material, will result in less microscratch formation. Therefore it is believed that microscratch formation may be reduced or minimized by using diluted slurries, polishing the substrate surface in multiple-step processes to remove residual materials, reducing the total polishing time, particularly at an interface between dielectric materials, or combinations thereof.

Additionally, it was observed that using filters in the abrasive solution recirculation loop of the polishing apparatus reduced microscratch formation. It was also observed that decreasing filter sizes of 10 microns, 5 microns, and 2 micron filters corresponds to decreasing in microscratch formation. A 10 micron filter size generally results in a 100 efficiency in removing particulate matter of 10 microns or greater in size from the material flowing through the filter. An example of the filter effectiveness in reducing microscratch formation is the use of the 2 filter in the abrasive solution recirculation loop, which was observed to reduce microscratch formation by 60% or greater.

While the foregoing is directed to embodiments of the present invention, other and further embodiments of the invention may be devised without departing from the basic scope thereof, and the scope thereof is determined by the claims that follow.

What is claimed is:

1. A method for processing a substrate, comprising:
    positioning a substrate comprising at least first dielectric material and second dielectric material disposed thereon in a polishing apparatus having polishing media disposed thereon;
    polishing the substrate with a first polishing composition having a first selectivity, wherein the first polishing composition comprises an abrasive solution; and
    polishing the substrate with a second polishing composition having a second selectivity greater than the first selectivity, wherein the second polishing composition comprises an abrasive solution, an additive, and water.

2. The method of claim 1, wherein the first dielectric material comprises silicon oxide and the second dielectric material comprises silicon nitride.

3. The method of claim 2, wherein the first polishing composition has a first selectivity comprising a removal rate ratio of silicon oxide to silicon nitride between about 1:1 and about 5:1 and the second polishing composition has a second selectivity comprising a removal rate ratio of silicon oxide to silicon nitride of about 30:1 or greater.

4. The method of claim 1, wherein the first polishing composition comprises a silica containing abrasive solution and the second polishing composition comprises a ceria containing abrasive solution.

5. The method of claim 1, wherein the second polishing composition has an abrasive solution concentration of about 50% or less of the first polishing composition.

6. The method of claim 5, wherein the first polishing composition comprises between about 30 wt. % and about 50 wt. % abrasive solution and the second polishing composition comprises between about 10 wt. % and about 30 wt. % abrasive solution.

7. The method of claim 1, wherein the concentration of the additive is greater than the abrasive solution concentration of the second polishing composition.

8. The method of claim 1, wherein the second polishing composition has a ratio of abrasive solution to additive of about 1:2.2.

9. The method of claim 1, wherein the second polishing composition includes the abrasive solution, the additive, and water and has a ratio of abrasive solution to additive to water of about 1:11:8.

10. The method of claim 1, wherein polishing with the first polishing composition is performed at a first polishing time and polishing with the second polishing composition is performed at a second polishing time less than the first polishing time.

11. The method of claim 1, wherein polishing with the first polishing composition is performed at a first polishing station and polishing with the second polishing composition is performed at a second polishing station.

12. The method of claim 1, wherein polishing with the first polishing composition is performed at a first and second polishing station of the polishing apparatus and polishing with the second polishing composition is preferred at a third polishing station of the polishing apparatus.

13. The method of claim 1, wherein polishing with the first polishing composition is performed at a first polishing station of the polishing apparatus and polishing with the second polishing composition is performed at a second and third polishing station of the polishing apparatus.

14. The method of claim 13, wherein polishing with the second polishing composition further comprises diluting the second polishing composition with an additive, water, or a combination thereof, on the third platen.

15. A method for processing a substrate, comprising:
    providing a substrate having at least first dielectric material and second dielectric material disposed thereon in a polishing apparatus;
    polishing the substrate on a first platen with a first polishing composition comprising a removal rate ratio of the first dielectric material and the second dielectric material between about 1:1 and about 5:1;
    polishing the substrate on a second platen with a second polishing composition, wherein the second polishing composition comprises an abrasive solution, an additive, and water; and
    polishing the substrate on a third platen with a third polishing composition comprising a removal rate ratio of the first dielectric material and the second dielectric material of about 30:1 or greater, wherein the third polishing composition comprises an abrasive solution, an additive, and water.

16. The method of claim 15, wherein the third composition comprises the second polishing composition diluted with an additive, water, or both.

17. The method of claim 15, wherein the first dielectric material comprises silicon oxide and the second dielectric material comprises silicon nitride.

18. The method of claim 15, wherein the second polishing composition comprises a removal rate ratio of the first dielectric material and the second dielectric material of about 30:1 greater.

19. A method for claim 15, wherein the second and third polishing compositions comprise the same polishing composition.

20. The method of claim 15, further comprising rinsing the substrate following polishing.

21. The method of claim 15, wherein the first dielectric material comprises silicon oxide and the second dielectric material comprises silicon nitride.

22. A method for processing a substrate, comprising:
    providing a substrate having at least first dielectric material and second dielectric material disposed thereon in a polishing apparatus;
    polishing the substrate on a first platen with a first polishing composition comprising a removal rate ratio of the first dielectric material and the second dielectric material of about 30:1 or greater;

polishing the substrate on a second platen with a second polishing composition; and polishing the substrate on a third platen with a third dishing composition comprising a removal rate ratio of the first dielectric material and the second dielectric material between about 1:1 and about 5:1.

23. The method of claim 22, wherein the second polishing composition comprises a removal rate ratio of the first dielectric material and the second dielectric material between about 1:1 and about 5:1.

24. The method of claim 22, wherein the first and second polishing compositions are the same polishing composition.

25. The method of claim 22, wherein the first dielectric material comprises silicon oxide and the second dielectric material comprises silicon nitride.

26. The method of claim 22, wherein the second polishing composition comprises a removal rate ratio of the first dielectric material arid the second dielectric material of about 30:1 or greater.

27. The method of claim 26, wherein the second and third polishing compositions comprise the same polishing composition.

28. The method of claim 22, further comprising rinsing the substrate following polishing.

29. The method of claim 22, wherein the first dielectric material comprises silicon oxide and the second dielectric material comprises silicon nitride.

30. A method for processing a substrate, comprising:
positioning a substrate comprising at least first dielectric material and second dielectric material disposed thereon in a polishing apparatus having polishing media disposed thereon;

polishing the substrate with a first polishing composition having a first selectivity, wherein the first polishing composition comprises an abrasive solution;

polishing the substrate with a second polishing composition having a second selectivity greater than the first selectivity, wherein the second polishing composition comprises an abrasive solution, an additive, and water; and polishing the substrate with a third polishing composition having a third selectivity greater than the first selectivity, wherein the third polishing composition comprises an abrasive solution, an additive, and water.

31. The method of claim 30, wherein the first dielectric material comprises silicon oxide and the second dielectric material comprises silicon nitride.

32. The method of claim 31, wherein the first polishing composition has a first selectivity comprising a removal rate ratio of silicon oxide to silicon nitride between about 1:1 and about 5:1, the second polishing composition has a second selectivity comprising a removal rate ratio of silicon oxide to silicon nitride of about 30:1 or greater, and the third polishing composition has a third selectivity comprising a removal rate ratio of silicon oxide to silicon nitride of about 30:1 or greater.

33. The method of claim 30, wherein the first polishing composition comprises a silica containing abrasive solution, the second polishing composition comprises a ceria containing abrasive solution, and the third polishing composition comprises a ceria containing abrasive solution.

34. The method of claim 33, wherein the third polishing composition has a cerie containing abrasive solution concentration less than the second polishing composition.

35. The method of claim 30, wherein the third composition comprises the second polishing composition diluted with an additive, water, or both.

36. The method of claim 30, wherein the second polishing composition has a ratio of abrasive solution to additive of about 1:2.2 and the third polishing composition has a ratio of abrasive solution to additive to deionized water of about 1:11:8.

37. The method of claim 30, wherein polishing with the first polishing composition is performed at a first polishing station, polishing with the second polishing composition is performed at a second polishing station, and polishing with the third polishing composition is preferred at a third polishing station of the polishing apparatus.

38. The method of claim 30, wherein dishing with the first polishing composition is performed at a first polishing station of the polishing apparatus and polishing with the second polishing composition and third polishing composition is performed at a second polishing station of the polishing apparatus.

39. The method of claim 30, wherein the second polishing composition has a ratio of abrasive solution to additive of less than 1:2.2 and the third polishing composition has a ratio of abrasive solution to additive of less than 1:2.2.

40. The method of claim 30, wherein the second polishing composition has a ratio of abrasive solution to additive of about 1:2.2 and the third polishing composition has a ratio of abrasive solution to additive of about 1:2.2.

41. The method of claim 30, wherein the second polishing composition has a ratio of abrasive solution to additive to deionized water of about 1:11:8 and the third polishing composition has a ratio of abrasive solution to additive to deionized water of about 1:11:8.

42. A method for processing a substrate, comprising:
positioning a substrate comprising at least first dielectric material and second dielectric material disposed thereon in a polishing apparatus having polishing media disposed thereon;

polishing the substrate with a first polishing composition having a first selectivity;

polishing the substrate with a second polishing composition having a second selectivity greater than the first selectivity; and polishing the substrate with a third polishing composition having a third selectivity greater than the first selectivity, wherein the third composition comprises the second polishing composition diluted with an additive, water, or both.

43. The method of claim 42, wherein the first dielectric material comprises silicon oxide and the second dielectric material comprises silicon nitride.

44. The method of claim 43 wherein the position has a first selectivity comprising a removal rate ratio of silicon oxide to silicon nitride between about 1:1 and about 5:1, the second polishing composition has a second selectivity comprising a removal rate ratio of silicon oxide to silicon nitride of about 30:1 or greater, and the third polishing composition has a third selectivity comprising a removal rate ratio of silicon oxide to silicon nitride of about 30:1 or greater.

45. The method of claim 42, wherein the first polishing composition comprises an abrasive solution, the second polishing composition comprises an abrasive solution, an additive, deionized water, or combinations thereof, and the third polishing composition comprises an abrasive solution, an additive, deionized water, or combinations thereof.

46. The method of claim 45, wherein the third polishing composition has an abrasive solution concentration less than the second polishing composition.

47. The method of claim 45, wherein the first polishing composition comprises a silica abrasive solution, the second polishing composition comprises a first ceria containing abrasive solution, and the third polishing composition comprises a second ceria containing abrasive solution.

48. The method of claim 42, wherein the polishing composition has a ratio of abrasive solution to additive of about 1:2.2 and the third polishing composition has a ratio of abrasive solution to additive to deionized water of about 1:11:8.

49. The method of claim 42, wherein polishing with the first polishing composition is performed at a first polishing station, polishing with the second polishing composition is performed at a second polishing station, and polishing with the third polishing composition is performed at a third polishing station of the polishing apparatus.

50. The method of claim 42, wherein polishing with the first polishing composition is performed at a first polishing station of the polishing apparatus and polishing with the second polishing composition and third polishing composition is performed at a second polishing station of the polishing apparatus.

51. A method for processing a substrate, comprising:
positioning a substrate comprising at least first dielectric material and second dielectric material disposed thereon in a polishing apparatus having polishing media disposed thereon;
polishing the substrate with a first polishing composition having a first removal rate ratio of first dielectric material to second dielectric material of about 30:1 or greater;
polishing the substrate with a second polishing composition having a second removal rate ratio of first dielectric material to second dielectric material of about 30:1 or greater; and
polishing the substrate with a third polishing composition having a third removal rate ratio of first dielectric material to d dielectric material of about 30:1 or greater, wherein the third composition comprises the second polishing composition diluted with an additive, water, both.

52. The method of claim 51, wherein the first dielectric material comprises silicon oxide and the second dielectric material comprises silicon nitride.

53. The method of claim 51, wherein the first polishing composition comprises an abrasive solution, an additive, deionized water, or combinations thereof, the second polishing composition comprises an abrasive solution, an additive, deionized water, or combinations thereof, and the third polishing composition comprises an abrasive solution, an additive, deionized water, or combinations thereof.

54. The method of claim 53, wherein the third polishing composition has an abrasive solution concentration less than the second polishing composition.

55. The method of claim 53, wherein the first polishing composition comprises a first ceria containing abrasive solution, the second polishing composition comprises a second ceria containing abrasive solution, and the third polishing composition comprises a third ceria containing abrasive solution.

56. The method of claim 51, wherein the first and second polishing composition has a ratio of abrasive solution to additive of about 1:2.2 and the third polishing composition has a ratio of abrasive solution to additive to deionized water of about 1:11:8.

57. The method of claim 51, wherein polishing with the first polishing composition is performed at a first polishing station, polishing with the second polishing composition is perform at a second polishing station, and polishing with the third polishing composition is performed at a third polishing station of the polishing apparatus.

58. The method of claim 51, wherein polishing with the first polishing composition is performed at a first polishing station of the polishing apparatus and polishing with the second polishing composition and third polishing composition is performed at a second polishing station of the polishing apparatus.

* * * * *

UNITED STATES PATENT AND TRADEMARK OFFICE
CERTIFICATE OF CORRECTION

| | | |
|---|---|---|
| PATENT NO. | : 6,811,470 B2 | Page 1 of 1 |
| APPLICATION NO. | : 10/194560 | |
| DATED | : November 2, 2004 | |
| INVENTOR(S) | : Bonner Benjamin A. et al. | |

It is certified that error appears in the above-identified patent and that said Letters Patent is hereby corrected as shown below:

In column 16, line 51, after "30:1", insert "or".

In column 16, line 52, delete "A method" and replace with "The method".

In column 17, line 4, delete "dishing" and replace with "polishing".

In column 17, line 63, after "has a", delete "cerie" and replace with "ceria".

In column 18, line 1, after "claim", delete "30" and replace with "35".

In column 18, line 10, after "composition is", delete "preferred" and replace with "performed".

In column 16, line 51, after "wherein" delete "dishing" and replace with "polishing".

In column 18, line 49, delete "position" and replace with "first polishing composition".

In column 19, line 4, after "wherein the" insert "second".

In column 19, line 36, after "material to", delete "d" and replace with "second".

In column 20, line 28, delete "perform" and replace with "performed".

Signed and Sealed this

Eighth Day of August, 2006

JON W. DUDAS
*Director of the United States Patent and Trademark Office*